United States Patent [19]

Dale et al.

[11] 4,368,430
[45] Jan. 11, 1983

[54] FIBER OPTIC MAGNETIC SENSORS

[75] Inventors: John C. Dale, Bedford; Glen A. Rines, Brookline, both of N.H.; Harrison W. Fuller, Lexington, Mass.

[73] Assignee: Sanders Associates, Inc., Nashua, N.H.

[21] Appl. No.: 179,346

[22] Filed: Aug. 18, 1980

[51] Int. Cl.³ .................. G01R 33/032; G01R 33/038
[52] U.S. Cl. .................................. 324/244; 250/227; 324/259
[58] Field of Search .................. 324/244, 259, 260; 250/227

[56] References Cited

U.S. PATENT DOCUMENTS 3,412,324 11/1968 Ludewig ........................... 324/259
4,071,753 1/1978 Fulenwider et al. ............... 250/227
4,234,788 11/1980 Palmer et al. ...................... 250/227

FOREIGN PATENT DOCUMENTS 2034344 1/1972 Fed. Rep. of Germany ...... 250/227

Primary Examiner—Gerard R. Strecker
Attorney, Agent, or Firm—Louis Etlinger; Richard I. Seligman

[57] ABSTRACT

A magnetometer which includes a pair of spaced apart optical fibers at least one of which comprises a cantilevered beam having a dipolar magnet thereon such that fluctuations of the magnetic H field will cause fluctuating mechanical torque on the magnet which will be applied to the cantilevered optical fiber to deflect same and occasion modulation of an optical signal transmitted between the two fibers.

6 Claims, 5 Drawing Figures

FIBER OPTIC MAGNETIC SENSORS

BACKGROUND OF THE INVENTION

This invention relates to magnet sensors such as magnetometers, gradiometers and magnetic-heading sensors and more particularly to fiber optic magnetic sensors.

The prior art is replete with many variations of magnetic sensors including flux gate and optically-pumped magnetometers, cryogenic squid sensor gradiometers and heading sensors such as magnetic dipolar floats and strain gauges. All of these devices have one or more of the following disadvantages: excessive bulk, slow response, require liquid helium cryogenic temperatures and poor mechanical reliability.

Accordingly, it is an object of this invention to provide improved magnetic sensors.

SUMMARY OF THE INVENTION

Briefly, magnetometers are provided which comprise a pair of spaced apart optical fibers at least one of which forms a cantilevered beam and has a dipolar magnet mounted thereon. A first embodiment includes only a single cantilevered beam and has some misalignment between the axes of the spaced apart optical fibers to improve sensitivity. In an alternate embodiment two aligned and matched cantilevered beams are provided with each having a magnet thereon. This embodiment increases sensitivity since a magnetic field will produce a differential displacement. It also is desirable in that acceleration disturbances imposed on the fibers due to gravity or vibration act in a common mode and are cancelled.

The second embodiment is also useful as a gradiometer if the magnets mounted on the fibers are disposed so that opposite polarities are adjacent to each other.

BRIEF DESCRIPTION OF THE DRAWINGS

The above-mentioned and other features and objects of this invention will become more apparent by reference to the following description taken in conjunction with the accompanying drawings, in which.

DESCRIPTION OF PREFERRED EMBODIMENTS

Figure 1:
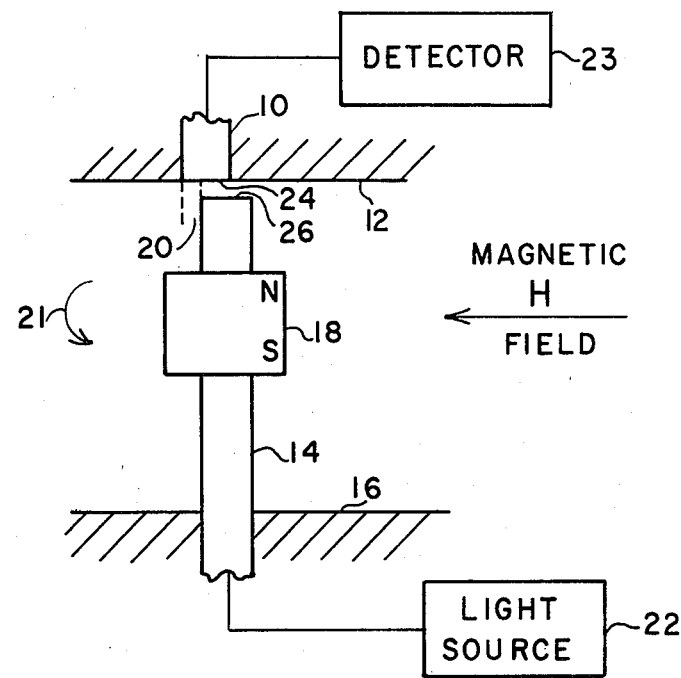
FIG. 1 is an illustration of a fiber optic magnetometer.

Referring now to FIG. 1 of the drawings, there is illustrated thereby a first embodiment of the invention for a fiber optic magnetic sensor and in particular, a magnetometer. The principle components of the fiber optic magnetometer include a first optical fiber 10 disposed within a support 12 so as to remain stationary and a second optical fiber 14 fixed to a support 16 but extending therefrom to form a cantilevered beam.

The cantilevered beam is loaded with a dipolar magnet 18 having a magnetic moment along the longitudinal axis of optical fiber 14. For certain applications the magnetic moment may be normal to fiber 14. The optical fibers 10 and 14 may be axially aligned, however, it is preferred that they be offset by an amount 20 which may be on the order of 50% of the fiber-core diameter. This offset provides maximum change in optical coupling between the two fibers with small bending displacement of the cantilevered optical fiber 14 in the direction of the offset.

Light is applied to one end of the fibers 10 or 14, for example by applying the output of a light source 22, as for example a laser diode or LED to fiber 14. The light is detected at the end of the other fiber, in this case fiber 10, by a detector 23. While the term light is used throughout this specification, it is to be understood that the term includes both the visible and invisible and includes all wavelengths which can be transmitted by the optical fibers.

Fluctuations of the magnetic H field, which is orthogonal to the longitudinal axis of the cantilevered optic fiber 14, will cause fluctuating mechanical torque on magnet 18, as indicated by the arrow 21, which will be applied to the cantilevered optical fiber 14 to which it is attached. Deflection of the cantilevered beam optical fiber 14 will produce fluctuational coupled light from optical fiber 14 to optical fiber 10 with such fluctuations being proportional to the applied magnetic field.

If the ends 24, 26 of the optical fibers are drawn down to have an end core diameter of approximately one or two microns, and if an offset 20 of one micron is employed, the modulation of coupled light with sidewise displacement in the offset direction will be approximately 50% per micron.

Figure 2:
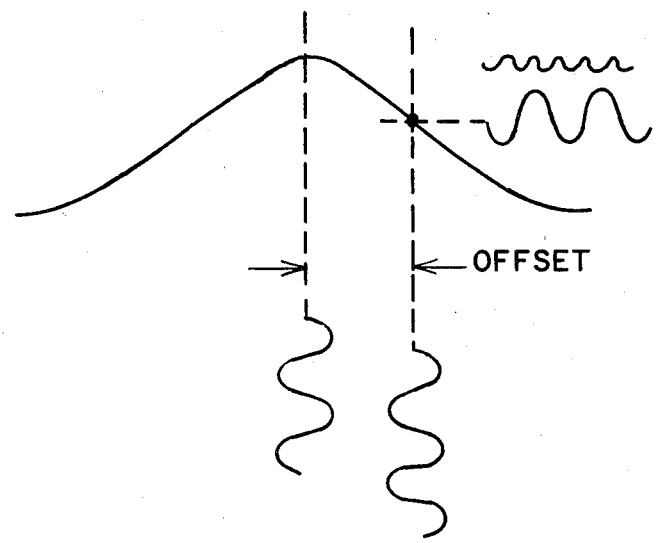
FIG. 2 is a graph illustrating how the sensitivity of the magnetometer of FIG. 1 is improved by providing misalignment of the fibers thereof.

The greater sensitivity employing the offset between the two fibers 10, 14 is illustrated by the curve of FIG. 2 wherein it is shown that by offsetting the fibers, the transfer function is more linear than without such offset and, thus, provides much greater sensitivity to field-produced displacements. Note that without the displacement the output is smaller in magnitude and at twice the frequency of the input. For certain applications it may be desirable to not use the offset in order to obtain the second harmonic signal.

If 5 milliwatts average optical power is coupled by the fibers, the quiescent photons coupled per second is $U = I/h\nu$, with $I = 5$ millijoules/sec, $h = $ Plancks constant $= 6 \times 10^{-34}$ joules-sec, and $\nu = $ light frequency $= c/\lambda = (3 \times 10^8 \text{ m/sec})/(10^{-6} \text{ m})$, where c is velocity of light, and $\lambda$ is wavelength of light (about 1 micron $= 10^{-6}$ meters). The fluctuation shot noise is well known to be of order $\sqrt{U}$, giving a shot noise limited signal to noise ratio of $\Delta U/\sqrt{U}$, where $\Delta U$ is the signal, i.e., the magnetically-induced change in coupled light. With $K = 0.5$ per micron of displacement, and $\Delta S = $ the magnetically caused displacement, the displacement that can be sensed with one second integration time is $$\Delta S = \frac{SNR}{K} \sqrt{\frac{h\nu}{I}} = 10^{-8} \text{ microns.}$$

Now the displacement of the cantilever beam is well known to be $\Delta S = (Pl^3/3EI_z)$, where P is the force applied at the end of the cantilever beam, l is the beam-length, E is the modulus of elasticity ($E = 3.4 \times 10^{10}$ Kgm/sec$^2$ m$^2$ for glass), and $I_z$ is the moment of inertia of a (circular) beam, i.e., $I_z = \pi D^4/64$ for diameter D. If the moment is a long (length $\sim l$) dipole fixed at the out end of the cantilever, as shown and is of cross-sectional area A, and permanent magnetization $10^{+3} = M_R$ (as for Alnico-5), then it is well known that the pole strength of each pole is $m = M_R A = 10^{-3} \times 10^{-3}$ for area $= 10^{-3}$ cm$^2$ i.e., a magnet diameter of $D_m \sim 300$ microns. Then the force P on the upper pole is $P = mH = (1 \text{ pole})(1 \text{ oersted})$ for earth's field $\sim 1$ oer.), and inserting this in the $\Delta S$ expression, using $l = 1$ cm, D = 50 microns, gives $\Delta S = 320$ microns. Thus, with a sensitivity of $\Delta S = 10^{-8}$ microns previously shown, the magnetic sensitivity of the device is $$\frac{10^{-8}}{320} \times H(\text{oe}) = 10^{-11} \text{oe},$$

or about $10^{-6} \gamma$ ($1\gamma = 10^{-5}$ oersteds).

Figure 5:
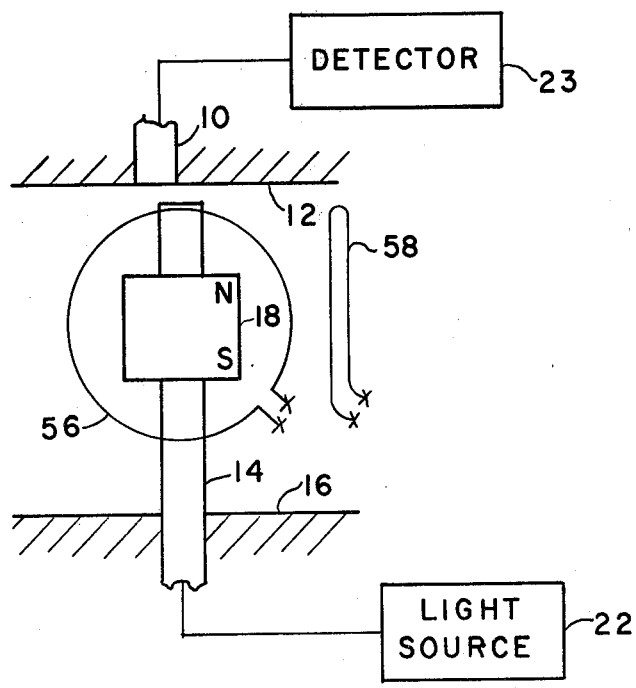
FIG. 5 is an illustration of a fiber optic magnetometer like that of FIG. 1 and including ambient field cancellation means.

This sample calculation shows the great sensitivity obtainable with the device. Realization of this sensitivity in the presence of a large ambient field such as that of the earth requires adaptive cancellation of part of the ambient field by an auxiliary field-generating means to reduce the beam deflection to the order of 1 micron so as to remain within the dynamic range of the sensor. This is illustrated in FIG. 5 wherein orthogonal coils 56 and 58 furnish such compensation. These coils would be driven by auxiliary vector field sensors with frequency filtering to exclude rate of change components within the signal spectrum of field-charge measurements, as is conventional. Measurements of lower sensitivity (less than $10^{-3}\gamma$), as required for usual earth's field anomalies and heading sensors, would not require such additional cancellation means.

Figure 3:
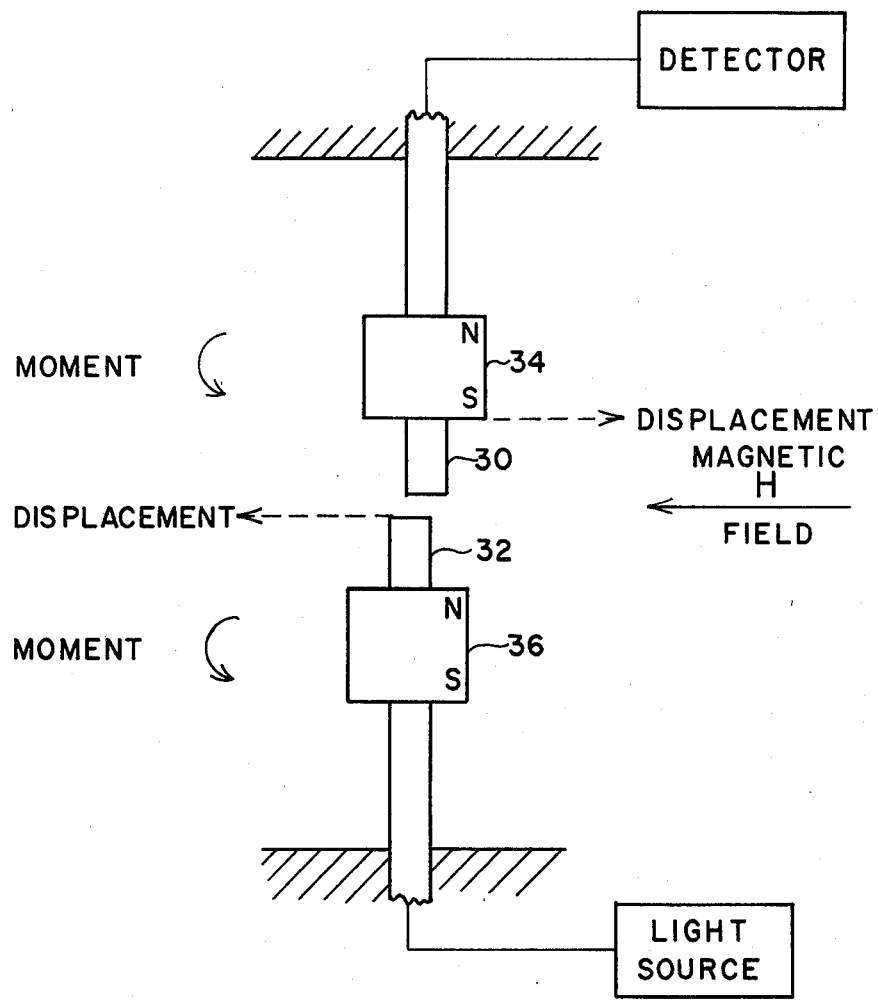
FIG. 3 is an illustration of another embodiment of a magnetometer which is insensitive to acceleration forces.

For magnetometers in the earth's field the background fluctuation of the field reduces the useful sensitivity of a magnetometer to about $10^{-2}\gamma$. Thus, the design of a magnetometer allows many tradeoffs in parameters. A limitation of the present technique is sensitivity of the magnetometer to accelerations, as induced by orientation changes of the mass-loaded cantilever beam in the earth's gravitational field or as induced by unwanted vibration and shock. The embodiment of FIG. 3 mitigates these effects.

In this embodiment, two matched and aligned optical fibers 30 and 32 form cantilevered beams with each having a dipolar magnet attached thereto. The magnets 34 and 36 are attached to the optical fibers 30 and 32, respectively, so that the ends thereof which face each other are of opposite polarity. Acceleration disturbances are mitigated since gravity or vibration forces act in a common mode manner on the matched beams while the magnetic field produces a differential displacement to double the effect on the fiber displacement and, therefore, the optical coupling magnetic signal between the two fibers.

Figure 4:
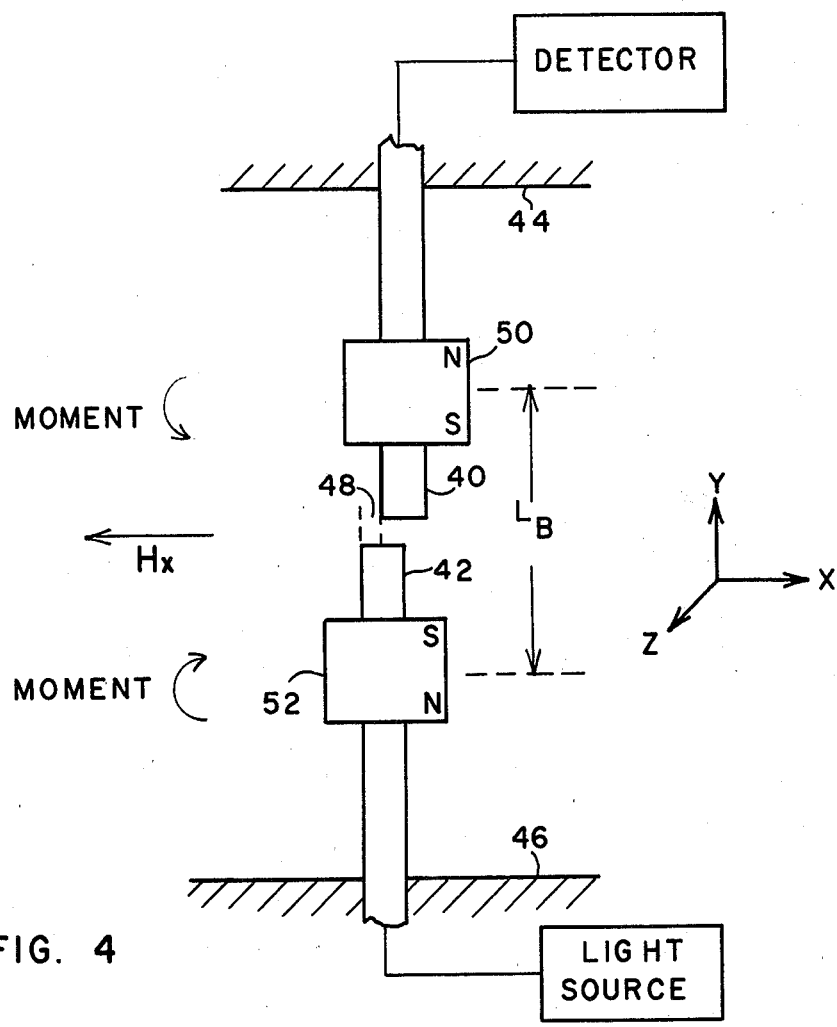
FIG. 4 is an illustration of a fiber optic gradiometer.

For magnetic gradiometer instrumentation, the embodiment of FIG. 4 is preferred (although two matched and oriented magnetometers spread apart in the gradient direction may be employed). In this embodiment, two optical fibers 40, 42 are mounted in supports 44, 46, respectively, to form cantilevered beams. As in the embodiment of FIG. 1, the optical fibers are preferably aligned with an offset 48 between them. A magnet 50 is mounted on optical fiber 40 and a magnet 52 mounted on optical fiber 42. The dipolars in this embodiment are reversed so that in a uniform, magnetic field no net fiber displacement will occur.

When there is nonuniformity of the magnetic field in the fiber-axis direction a differential fiber displacement will occur proportional to the field, and to the separation between magnet centers $L_B$. The same benefits of desensitization to extraneous acceleration forces occur as in the embodiment of FIG. 3, but is of greater importance in this application since a small gradient measurement is desired. The gradiometer illustrated provides $(\partial H_x/\partial y)$; other orientations of fiber axis, offset and dipole orientations can provide the other eight gradients, $(\partial H_i/\partial \eta_j)$, although only five of the total of nine gradients constitute independent measurements, and only five gradients are normally required for a complete description of the field resulting from a dipolar source of magnetic anomaly. In this regard, reference is made to "Advanced Superconductive Gradiometer/Magnetometer Arrays and a Novel Signal Processing Technique," W. M. Wyne, et al, IEEE *Transactions on Magnetics*, Vol. MAG-11, No. 2, March 1975, pg. 701.

While specific embodiments of a magnetic sensor have been described, it is to be understood that the embodiments shown are illustrative only, and that many variations and modifications may be made without departing from the principles of the invention herein disclosed and deferred by the appended claims.

We claim:

1. A magnetic sensor, comprising:
   a first optical fiber, said first optical fiber being arranged as a cantilevered beam, and including a first dipolar magnet mounted on said cantilevered first optical fiber;
   a second optical fiber spaced from said first optical fiber so as to produce a gap between the ends thereof, said second optical fiber being arranged as a cantilevered beam; and
   a second dipolar magnet mounted on said cantilevered second optical fiber such that the optical coupling between said optical fibers varies proportionally to fluctuations of a component of the magnetic field substantially orthogonal to the longitudinal axes of said cantilevered beams which causes fluctuating magnetic torque on said magnets.

2. The sensor of claim 1 wherein the ends of said first and second fibers are misaligned to increase the sensitivity of said sensor.

3. The sensor of claims 1 or 2 further including means for applying light to said second optical fiber and means coupled to said first optical fiber to detect the amount of light transmitted from said second optical fiber to said first optical fiber.

4. A magnetic sensor, comprising:
   a first optical fiber, said first optical fiber arranged as a cantilevered beam, and including a first dipolar magnet mounted on said cantilevered first optical fiber;
   a second optical fiber spaced from said first optical fiber so as to produce a gap between the ends thereof, said second optical fiber being arranged as a cantilevered beam; and
   a second dipolar magnet mounted on said cantilevered second optical fiber in polarity opposition to said first dipolar magnet such that the optical coupling between said optical fibers varies proportionally to fluctuations of a spacially varying component of the magnetic field substantially orthogonal to the longitudinal axes of said cantilevered beams which causes fluctuating magnetic torque on said magnets.

5. The sensor of claim 4, further including means for applying light to said second optical fiber and means coupled to said first optical fiber to detect the amount of light transmitted from said second optical fiber to said first optical fiber.

6. The sensor of claim 4 wherein the ends of said first and second optical fibers are misaligned to increase the sensitivity of said sensor.

* * * * *